United States Patent
Kennedy

(10) Patent No.: US 9,938,626 B2
(45) Date of Patent: Apr. 10, 2018

(54) METHOD FOR COATING A SLIDING ELEMENT USING A NANOPARTICLES INFUSED COATING

(71) Applicant: FEDERAL-MOGUL BURSCHEID GMBH, Burscheid (DE)

(72) Inventor: Marcus Kennedy, Dusseldorf (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 174 days.

(21) Appl. No.: 14/813,481

(22) Filed: Jul. 30, 2015

(65) Prior Publication Data

US 2015/0330508 A1 Nov. 19, 2015

Related U.S. Application Data

(62) Division of application No. 13/257,396, filed as application No. PCT/EP2009/066824 on Dec. 10, 2009.

(30) Foreign Application Priority Data

Mar. 19, 2009 (DE) .................. 10 2009 013 855

(51) Int. Cl.
| | |
|---|---|
| *C23C 14/06* | (2006.01) |
| *C23C 30/00* | (2006.01) |
| *C23C 16/30* | (2006.01) |
| *C23C 16/34* | (2006.01) |
| *F16J 9/26* | (2006.01) |

(52) U.S. Cl.
CPC ............ *C23C 30/00* (2013.01); *C23C 16/303* (2013.01); *C23C 16/308* (2013.01); *C23C 16/34* (2013.01); *F16J 9/26* (2013.01); *Y10T 428/25* (2015.01); *Y10T 428/263* (2015.01)

(58) Field of Classification Search
CPC ..... C23C 16/303; C23C 16/308; C23C 16/34; C23C 14/0676; C23C 14/0641
See application file for complete search history.

(56) References Cited

U.S. PATENT DOCUMENTS

| | | | | |
|---|---|---|---|---|
| 5,618,590 A | * | 4/1997 | Naruse | C23C 14/0688 204/192.16 |
| 6,060,182 A | * | 5/2000 | Tanaka | C23C 14/0641 277/443 |
| 6,372,369 B1 | * | 4/2002 | Ito | C23C 14/0057 106/286.1 |
| 6,631,907 B1 | * | 10/2003 | Onoda | F16J 9/26 277/443 |
| 6,666,983 B2 | | 12/2003 | Marietti et al. | |
| 2002/0022129 A1 | * | 2/2002 | Moronuki | C23C 16/30 428/408 |
| 2007/0129233 A1 | * | 6/2007 | Ueno | B82Y 30/00 501/99 |
| 2009/0278320 A1 | * | 11/2009 | Araujo | C23C 14/0036 277/442 |
| 2011/0018207 A1 | * | 1/2011 | Ohishi | C21D 9/40 277/434 |

FOREIGN PATENT DOCUMENTS

WO WO 2007/147532 * 12/2007

OTHER PUBLICATIONS

Charoo, M.S., et al., "Tribological Properties of IF-MoS2 Nanoparticles as Lubricant Additive on Cylinder Liner and Piston Ring Tribo-pair." Tribology in Industry, vol. 38, No. 2 (2016) 156-162.*
Mahle Press release, "Piston rings with high-value PVD coating for high-speed diesel engines". Sep. 2007, pp. 1-2.*
Carley, Larry, "Performance Piston Rings". Engine Builder Magazine, Oct. 24, 2012, pp. 1-5.*
Merriam-Webster's Collegiate Dictionary, Tenth Edition, 1993, "Infuse", p. 600.*

* cited by examiner

*Primary Examiner* — Bret P Chen
(74) *Attorney, Agent, or Firm* — Robert L. Stearns; Dickinson Wright, PLLC

(57) ABSTRACT

A method wherein nanoparticle are first produced and then infused in the coating during the coating process by means of a PVD and/or CVD method. The coating is a material that contains nitrides. The nanoparticles are chosen from the group of oxides, carbides, and silicides, and one or more of the compounds comprise $Me_xO_y$, $Me_xC_y$, and $Me_xSi_y$ with Me: Cr, Ti, Ta, Si, In, Sn, Al, W, V, Mo and/or x=1 to 3 and/or =1 to 3.

13 Claims, No Drawings

METHOD FOR COATING A SLIDING ELEMENT USING A NANOPARTICLES INFUSED COATING

CROSS REFERENCE TO RELATED APPLICATION

This divisional application claims priority to U.S. Utility application Ser. No. 13/257,396, filed Dec. 5, 2011, which is a U.S. National Phase application of International Application PCT/EP2009/066824, filed Dec. 10, 2009, which claims priority to German Patent Application No. 102009013855.9, filed Mar. 19, 2009, all of which are incorporated herein by reference.

BACKGROUND OF THE INVENTION

1. Technical Field

This invention relates to a method for coating a sliding element and a sliding element, in particular a piston ring. It is a requirement for sliding elements, such as piston rings, that they only ever bring about small friction losses. For example, with piston rings acting as sliding elements in internal combustion engines, and increase in friction has a direct effect upon fuel consumption. Furthermore, oil consumption is affected by the condition of the piston rings. In particular, with regard to this, the so-called burn mark strength and outbreak strength, which must be particularly high in order to permanently realize the required friction values, are to be observed.

2. Related Art

As previously used items piston rings are known which are coated by means of PVD methods on a hard material base, in particular chromium nitride. Furthermore, the electrochemical deposition of chromium layers associated with the incorporation of Al2O3 or diamond particles, the size of which comes within the micrometer range, is known.

A DLC (diamond-like carbon) coating system, that can include tungsten carbide depositions in nanocrystalline form, which are produced during the separation process and are up to 10 nm in size, is revealed by WO 2007/079834 A1.

Finally, DE 199 58 473 A1 relates to a method for producing composite layers with a plasma beam source, wherein nanocrystalline particles can be embedded, and that can be combined with know, separately controllable CVD or PVD methods.

SUMMARY OF THE INVENTION

The object forming the basis of the invention is to make available a method for coating a sliding element and a corresponding sliding element with which the required friction and wear and tear properties can be realized over the required life span.

DETAILED DESCRIPTION

Therefore, the invention proposes a method for coating, comprising at least one layer and formed on at least one outer surface, a sliding element, in particular a piston ring, wherein nanoparticles are initially produced, and then infused into the coating during the coating process. In other words, the nanoparticles are not produced in situ, i.e. during the coating process, but they are produced separately, to a certain extend ex situ, and incorporated into the coating during the coating process. The mechanism which can be used in this way and which leads to improved mechanical properties, such as fatigue strength, burn mark strength, outbreak strength, breaking strength and elongation at rupture, functions as follows according to the current state of knowledge. It is also noted that the invention is not restriction to this. The incorporation of the described particles gives rise to local crystal lattice deformations which lead to the aforementioned, improved mechanical properties. Furthermore, an improvement of the wear and tear characteristics due to the exceptionally high grain limit density and increased elasticity and less friction are achieved.

The advantages of the infused nanoparticles can also be made use of in the dispersion or precipitation hardening to be implemented. That is to say, the displacements produced when stressed or already existing cannot be worked or "cut" through by the particles or the depositions, but bulge out to a certain extend between the particles. In this way, displacement rings are formed which must be bypassed by the displacement. With this bypassing, higher energy is required than when the latter are "cut through" by the particles or deposition. The loading capacity is thus increased. Furthermore, the invention advantageously further makes use of the effect that the yield stress for the migration of the displacements increases as the particle spacing decreases and the particle size decreases. The material strength increases due to this. This effect can be obtained particularly well with nanoparticles. Furthermore, it has been shown within the scope of the invention that upon the basis of their high defect density on the surface, the latter can be infused and incorporated practically independently of the material to be reinforced during the coating process. In this way, the desired depositions, which can be incoherent, partially coherent or coherent, and have the effects described above with regard to the mechanical properties, can advantageously be formed. The production of the nanoparticles ex situ advantageously further guarantees that the chemical and crystallographic structure of the nanoparticles can be controlled. Furthermore, by means of this control, when producing the nanoparticles it can be guaranteed that the later can be infused into the layer hereby growing during the coating process in the desired manner.

The coating as such is advantageously implemented by means of tried and tested PVD (physical vapour deposition) and/or CVD (chemical vapour deposition) coating processes.

Advantageous further developments of the method according to the invention are described in the further claims.

For the base material or the matrix of the coating a material that contains nitrides, in particular metal (oxy) nitrides, and in particular Cr(O)N, AlN, or TiN, has proven to be particularly advantageous.

In initial trails it transpired that a volume portion of the nanoparticles of 20% or less leads to good properties.

Furthermore, one was able to have good experiences with nanoparticles which have a particle size (diameter) of 1 to 100 nm, preferably 5 to 75 and in particular 5 to 50 nm.

For the nanoparticles compounds from the group of oxides, carbides, and/or silicides with the composition $Me_xO_y$, $Me_xC_y$ or $Me_xSi_y$ are preferred. The metal here can be chromium, titanium, tantalum, silicon, indium, tin aluminum, tungsten, vanadium or molybdenum, and or x can be 1 to 3 and/or y can be 1 to 3.

With regard to the layer thickness, particularly good properties, have been determined with a coating thickness of max. 100 µm, and preferably in the range of 5 to 50 µm.

Even though the coating according to the invention can be used in many different ways, due to the proven properties it is currently preferred if the base material, i.e. the material of the sliding element to be coated according to the invention, is case iron or steel.

The preferred embodiments of the sliding element according to the invention correspond to those of the method according to the invention for producing the latter. This applies in the same way to the advantages that occur, which lie in particular in a permanent sliding element permanently having the required friction values and wear and tear properties.

For the preferred case of a piston ring, it is mentioned that as sliding surfaces, one or more faces, i.e. the upper and/or the lower side and/or the contact surface, i.e. the outer cylinder surface of the piston ring, can be coated. The contact surface can be coated more thickly with the coating according to the invention with incorporated, separately produced nanoparticles than at least one of the faces. The cross-over between the contact surface and at least one face can be rounded on the coating, in the same way as this cross-over on the base material of the piston ring can be rounded. The coating of both faces can be of the same thickness. In particular application also only the contact surface can be coated.

What is claimed is:

1. A method for coating, comprising at least one layer and formed on at least one outer surface, a sliding element, wherein nanoparticles are initially produced, and then infused into the coating during the coating process, which is implemented by means of a PVD and/or a CVD method, the coating being formed containing a metal oxynitride.

2. The method according to claim 1, wherein the coating further includes a metal nitride.

3. The method according to claim 2, wherein the metal nitride is selected from at least one of CrN, AlN or TiN.

4. The method according to claim 1 wherein the coating is formed containing CrON.

5. The method according to claim 1, wherein the nanoparticles comprise up to 20 volume % of the coating.

6. The method according to claim 1, wherein the coating is formed such that the nanoparticles are 1 to 100 nm in size.

7. The method according to claim 6, wherein the nanoparticles are 5 to 75 nm in size.

8. The method according to claim 6, wherein the nanoparticles are 5 to 50 nm in size.

9. The method according to claim 1, wherein the coating is formed such that the nanoparticles are chosen from the group of oxides, carbides and silicides, and one or more of the compounds comprise $Me_xO_y$, $Me_xC_y$ and $Me_xSi_y$ with Me: Cr, Ti, Ta, Si, In, Sn, Al, W, V, Mo and x=1 to 3 and y=1 to 3.

10. The method according to claim 1, wherein the coating is formed with a total thickness of up to about 100 μm.

11. The method according to claim 10, wherein the total thickness is 5 to 50 μm.

12. The method according to claim 1, wherein the coating is formed over cast iron or steel as the base material of the sliding element.

13. The method according to claim 1, wherein the sliding element is a piston ring.

* * * * *